US009905679B2

(12) United States Patent
Magnee et al.

(10) Patent No.: US 9,905,679 B2
(45) Date of Patent: Feb. 27, 2018

(54) SEMICONDUCTOR DEVICE COMPRISING A BIPOLAR TRANSISTOR

(71) Applicant: NXP B.V., Eindhoven (NL)

(72) Inventors: Petrus Hubertus Cornelis Magnee, Redhill (GB); Joost Melai, Redhill (GB); Viet Thanh Dinh, Redhill (GB); Tony Vanhoucke, Redhill (GB)

(73) Assignee: NXP B.V., Eindhoven (NL)

( * ) Notice: Subject to any disclaimer, the term of this patent is extended or adjusted under 35 U.S.C. 154(b) by 7 days.

(21) Appl. No.: 14/988,441

(22) Filed: Jan. 5, 2016

(65) Prior Publication Data

US 2016/0197168 A1    Jul. 7, 2016

(30) Foreign Application Priority Data

Jan. 5, 2015   (EP) .................................... 15150069

(51) Int. Cl.
*H01L 29/732*   (2006.01)
*H01L 29/737*   (2006.01)
(Continued)

(52) U.S. Cl.
CPC ........ *H01L 29/7378* (2013.01); *H01L 29/063* (2013.01); *H01L 29/0817* (2013.01);
(Continued)

(58) Field of Classification Search
CPC . H01L 21/761; H01L 29/407; H01L 29/1004; H01L 21/28518; H01L 27/11807;
(Continued)

(56) References Cited

U.S. PATENT DOCUMENTS 4,494,134 A * 1/1985 Wildi .................... H01L 21/761
257/273
4,661,838 A * 4/1987 Wildi .................. H01L 29/7391
257/336
(Continued)

FOREIGN PATENT DOCUMENTS

EP           2466628 A1    6/2012
WO    WO-2012/175716 A1   12/2012

OTHER PUBLICATIONS

Appels, J. A., et al; "Thin Layer High-Voltage Devices (Resurf Devices)"; Philips Jnal of Research, vol. 35, No. 1; pp. 1-13 (Jan. 1, 1980).
(Continued)

*Primary Examiner* — Mohsen Ahmadi
*Assistant Examiner* — Fang-Xing Jiang

(57) ABSTRACT

A semiconductor device comprising a bipolar transistor and a method of making the same. The bipolar transistor includes a collector having a laterally extending drift region. The bipolar transistor also includes a base located above the collector. The bipolar transistor further includes an emitter located above the base. The bipolar transistor also includes a reduced surface field (RESURF) gate located above an upper surface of the laterally extending drift region for shaping an electric field within the collector. The bipolar transistor further includes a gap located between the reduced surface field gate and an extrinsic region of the base of the device, for electrically isolating the reduced surface field gate from the base. A lateral dimension $L_{gap}$ of the gap is in the range $0.1\ \mu m \leq L_{gap} \leq 1.0\ \mu m$.

15 Claims, 4 Drawing Sheets

(51) Int. Cl.
*H01L 29/423* (2006.01)
*H01L 29/06* (2006.01)
*H01L 29/08* (2006.01)
*H01L 29/10* (2006.01)
*H01L 29/40* (2006.01)
*H01L 29/66* (2006.01)
*H03F 3/21* (2006.01)

(52) U.S. Cl.
CPC ...... *H01L 29/0821* (2013.01); *H01L 29/1095* (2013.01); *H01L 29/402* (2013.01); *H01L 29/423* (2013.01); *H01L 29/66242* (2013.01); *H01L 29/732* (2013.01); *H01L 29/7371* (2013.01); *H03F 3/21* (2013.01)

(58) Field of Classification Search
CPC ............... H01L 29/0878; H01L 29/732; H01L 29/7378; H01L 29/7391; B23K 7/10
See application file for complete search history.

(56) References Cited

U.S. PATENT DOCUMENTS

| | | | | |
|---|---|---|---|---|
| 4,693,761 | A * | 9/1987 | Bohm | B23K 7/10 |
| | | | | 148/196 |
| 4,868,921 | A * | 9/1989 | Adler | H01L 29/0878 |
| | | | | 257/488 |
| 5,436,485 | A * | 7/1995 | Shikatani | H01L 27/11807 |
| | | | | 257/204 |
| 5,602,417 | A * | 2/1997 | Villa | H01L 29/1004 |
| | | | | 257/592 |
| 5,745,990 | A * | 5/1998 | Lee | H01L 21/28518 |
| | | | | 257/E21.165 |
| 7,132,344 | B1 | 11/2006 | Knorr | |
| 8,026,146 | B2 | 9/2011 | Donkers et al. | |
| 8,299,578 | B1 | 10/2012 | Babcock | |
| 2008/0017895 | A1 | 1/2008 | Fallica et al. | |
| 2008/0265329 | A1 | 10/2008 | Hirler et al. | |
| 2009/0212394 | A1 | 8/2009 | Melai et al. | |
| 2010/0022056 | A1 * | 1/2010 | Donkers | H01L 29/407 |
| | | | | 438/207 |
| 2012/0007176 | A1 | 1/2012 | Kadow et al. | |
| 2012/0119262 | A1 * | 5/2012 | Noort | H01L 29/1004 |
| | | | | 257/197 |
| 2013/0087799 | A1 | 4/2013 | Gridelet et al. | |
| 2013/0126945 | A1 | 5/2013 | Liu et al. | |

OTHER PUBLICATIONS

Extended European Search Report for application No. 15150069.1 (Jun. 29, 2015).
Knoll, D. et al; "A Low-Cost SiGe:C BiCMOS Technology with Embedded Flash Memory and Complementary LDMOS Module"; Proceedings of the Bipolar/BiCMOS Circuits and Technology Meeting; pp. 132-135 (2005).
Sorge, R. et al., "Concept of vertical bipolar transistor with lateral drift region, applied to high voltage SiGe HBT"; 2012 12th Topical Meeting on Silicon Monolithic Integrated Circuits in RF Systems (SiRF); pp. 223-226 (2012).
Hueting, R. et al. "A New Trench Biploar Transistor for RF Applications", IEEE Transactions on Electron Devices, vol. 51, No. 7, pp. 1108-1113, Jul. 2004.
Jain, S. et al. "Transient Enhanced Diffusion of Bron in Si", J. of Applied Physics, vol. 91, No. 11, pp. 8919-8941, Jun. 2002.
Rucker, H. et al. "Suppressed Diffusion of Boron and Carbon in Carbon-Rich Silicon", Appl. Phys. Lett., vol. 73, No. 12, pp. 1682-1684, Sep. 1998.
Taur, Y. et al. "Fundamentals of Modern VLSI Devices, Basic Device Physics", Cambridge Univ. Press, pp. 90-95, 1998.
European Search Report, 13166124.1, dated Sep. 13, 2013.

* cited by examiner

SEMICONDUCTOR DEVICE COMPRISING A BIPOLAR TRANSISTOR

CROSS-REFERENCE TO RELATED APPLICATIONS

This application claims priority to European Patent Application No. 15150069.1, filed on Jan. 5, 2015, the contents of which are incorporated entirely herein by reference.

FIELD OF THE INVENTION

This invention relates to a semiconductor device comprising a bipolar transistor.

BACKGROUND OF THE INVENTION

RF power amplifiers are key components in any high-frequency system and application. The demand for higher bandwidth and higher speeds for multimedia applications puts stringent requirements on these amplifiers such as high output power, linearity and efficiency. Amplifiers comprising bipolar transistors (such as heterojunction bipolar transistors (HBTs) are often used in preference to CMOS-based devices for RF power amplifiers because of their excellent performance at high frequencies.

R. Sorge et al., "Concept of vertical bipolar transistor with lateral drift region, applied to high voltage SiGe HBT", SiRF, 2012 describes a vertical bipolar transistors having an additional lateral drift region introduced between a sub collector and collector contact region.

SUMMARY OF THE INVENTION

Aspects of the invention are set out in the accompanying independent and dependent claims. Combinations of features from the dependent claims may be combined with features of the independent claims as appropriate and not merely as explicitly set out in the claims.

According to an aspect of the invention, there is provided a semiconductor device comprising a bipolar transistor and a method of making the same. The bipolar transistor includes a collector having a laterally extending drift region. The bipolar transistor also includes a base located above the collector. The bipolar transistor further includes an emitter located above the base. The bipolar transistor also includes a reduced surface field (RESURF) gate located above an upper surface of the laterally extending drift region for shaping an electric field within the collector. The bipolar transistor further includes a gap located between the reduced surface field gate and an extrinsic region of the base of the device, for electrically isolating the reduced surface field gate from the base. A lateral dimension $L_{gap}$ of the gap is in the range $0.1\ \mu m \leq L_{gap} \leq 1.0\ \mu m$.

According to another aspect of the invention, there is provided a method of making a semiconductor device comprising a bipolar transistor. The method includes providing a semiconductor substrate. The method also includes forming a collector on the substrate, the collector having a laterally extending drift region. The method further includes forming a base above the collector. The method also includes forming an emitter above the base. the method further includes forming a reduced surface field (RESURF) gate above an upper surface of the laterally extending drift region for shaping an electric field within the collector. The method further includes etching a gap between the reduced surface field gate and an extrinsic region of the base of the device, for electrically isolating the reduced surface field gate from the base. A lateral dimension $L_{gap}$ of the gap is in the range $0.1\ \mu m \leq L_{gap} \leq 1.0\ \mu m$.

Embodiments of this invention can allow the field within a collector of a bipolar transistor to be shaped (e.g. near a vertical base-collector junction of the device and/or in a laterally extending drift region of the collector) using the reduced surface field (RESURF) effect in a manner that can avoid an unwanted increase in capacitance between the base and collector of the device. This may be achieved by providing a gap between a reduced surface field (RESURF) gate of the device and an extrinsic region of the base to electrically isolate the reduced surface field gate from the base. Electrical isolation of the reduced surface field gate from the base can also allow for independent biasing of the gate and the base, for optimising the operation of the device. A lateral dimension of the gap is kept low ($0.1\ \mu m \leq L_{gap} \leq 1.0\ \mu m$) so as to minimise the distance between the reduced surface field gate and an active region of the device (e.g. the region of the device close to an emitter window of the device) for allowing field shaping close to the active region.

In accordance with an embodiment of the invention, a lateral distance $L_d$ between the reduced surface field (RESURF) gate and an emitter window of the device is in the range $0.2\ \mu m \leq L_d \leq 1.2\ \mu m$. The lateral dimension $L_d$ is at least in part influenced by the lateral dimension $L_{gap}$ of the gap, whereby minimising $L_{gap}$ can allow a smaller value of $L_d$. Reducing $L_d$ may allow closer control of the electric field near to the base-collector junction of the device, since the reduced surface field gate can be located closer to this junction.

In one embodiment, the gap can be formed by a method that includes depositing a dielectric layer over the emitter, wherein an edge of the dielectric layer defines a first edge of the gap. The method in this embodiment may also include depositing a photoresist layer, wherein the photoresist layer includes an opening through which the edge of the dielectric layer defining the first edge of the gap is exposed and wherein an edge of the opening opposite the edge of the dielectric layer defines a second edge of the gap.

The gap can then be etched using the opening in the photoresist layer, and using the edges of the dielectric layer and photoresist layer to form the edges of the gap. In this way, it has been demonstrated that a gap having a lateral dimension as small as $L_{gap} < 0.5\ \mu m$ or $L_{gap} < 0.2\ \mu m$ (or even $L_{gap} = 0.1\ \mu m$) can be etched. After the gap is etched, as a consequence of the above described masking and etching steps, an edge of the emitter proximal the gap may be vertically aligned with an edge of the extrinsic region of the base proximal the gap.

In one such embodiment, where $L_{gap} < 0.5\ \mu m$, a lateral distance $L_d$ between the reduced surface field (RESURF) gate and an emitter window of the device may be in the range $0.2\ \mu m \leq L_d < 0.6\ \mu m$. Where $L_{gap} < 0.2\ \mu m$, a lateral distance $L_d$ between the reduced surface field (RESURF) gate and an emitter window of the device may be as small as $0.2\ \mu m \leq L_d < 0.3\ \mu m$. Where $L_{gap} = 0.1\ \mu m$, a lateral distance $L_d$ between the reduced surface field (RESURF) gate and an emitter window of the device may be as small as $0.2\ \mu m$.

The reduced surface field (RESURF) gate may comprise a field plate separated from the upper surface of the laterally extending drift region by a dielectric.

In other examples, the reduced surface field (RESURF) gate may include a monocrystalline doped semiconductor portion in contact with the upper surface of the laterally extending drift region. The monocrystalline doped semiconductor portion may have a different conductivity type to that of the collector whereby a junction (such as a p-n junction) is formed at an interface between the monocrystalline doped semiconductor portion and the laterally extending drift region. The device may further include a doped polysilicon layer located above the monocrystalline doped semiconductor portion. The doped polysilicon layer may correspond to the extrinsic region of the base (e.g. be formed from the same layer during manufacture). A layer may be located between the doped polysilicon layer and the monocrystalline doped semiconductor portion. This may prevent dopants from the doped polysilicon layer entering the monocrystalline doped semiconductor portion, e.g. during any annealing steps used during manufacture.

In one embodiment, the device may also have a further doped region having a conductivity type that is different to that of the collector, extending laterally beneath the collector to form a junction at a region of contact between the further doped region and the collector. In this way, the reduced surface field (RESURF) effect may be used both above and below the laterally extending drift region of the collector, for shaping the field therein.

According to a further aspect of the invention, there is provided a power amplifier comprising s semiconductor device of the kind described above.

BRIEF DESCRIPTION OF THE DRAWINGS

Embodiments of the present invention will be described hereinafter, by way of example only, with reference to the accompanying drawings in which like reference signs relate to like elements and in which.

DETAILED DESCRIPTION

Embodiments of the present invention are described in the following with reference to the accompanying drawings.

Embodiments of this invention can provide a semiconductor device that includes a bipolar transistor. Embodiments of this invention can also provide a method of making a semiconductor device including a bipolar transistor. The bipolar transistor has a collector that has a laterally extending drift region, a base that is located above the collector and emitter that is located above the base. Accordingly, the bipolar transistor may be a vertically oriented device.

In order to allow for field shaping within the collector, the bipolar transistor can be provided with a reduced surface field (RESURF) gate that is located above an upper surface of the laterally extending drift region. The reduced surface field gate can, as explained in more detail below, comprise for instance a RESURF field-plate or a RESURF junction. In accordance with embodiments of this invention, a gap is located between the reduced surface field gate and an extrinsic region of the base. The gap can extend laterally along the device, above the laterally extending drift region. The gap allows the reduces surface field gate and the base to be electrically insulated from each other, which may have the effect of reducing unwanted capacitance between the base and the collector of the bipolar transistor. Electrical isolation of the reduced surface field gate from the base may also allow for independent biasing of the gate and the base, for optimising the operation of the device.

Given that there is a gap located between the reduced surface field gate and the extrinsic region of the base of the device, it will be appreciated that the reduced surface field gate is typically separated from an active region of the device (for instance defined by the lateral extent of an emitter window of the device, through which the emitter makes contact with the base). In order to ensure that the distance between the reduced surface field gate and the active region of the device is kept relatively small (e.g. for allowing field shaping close to the active region) the lateral dimension $L_{gap}$ of the gap may, in accordance with embodiments of this invention be relatively small. In particular, it is envisaged that the lateral dimension of the gap may be in the range 0.1 μm to 1.0 μm. Methods for making devices having a gap of this size will be described below.

Figure 1:
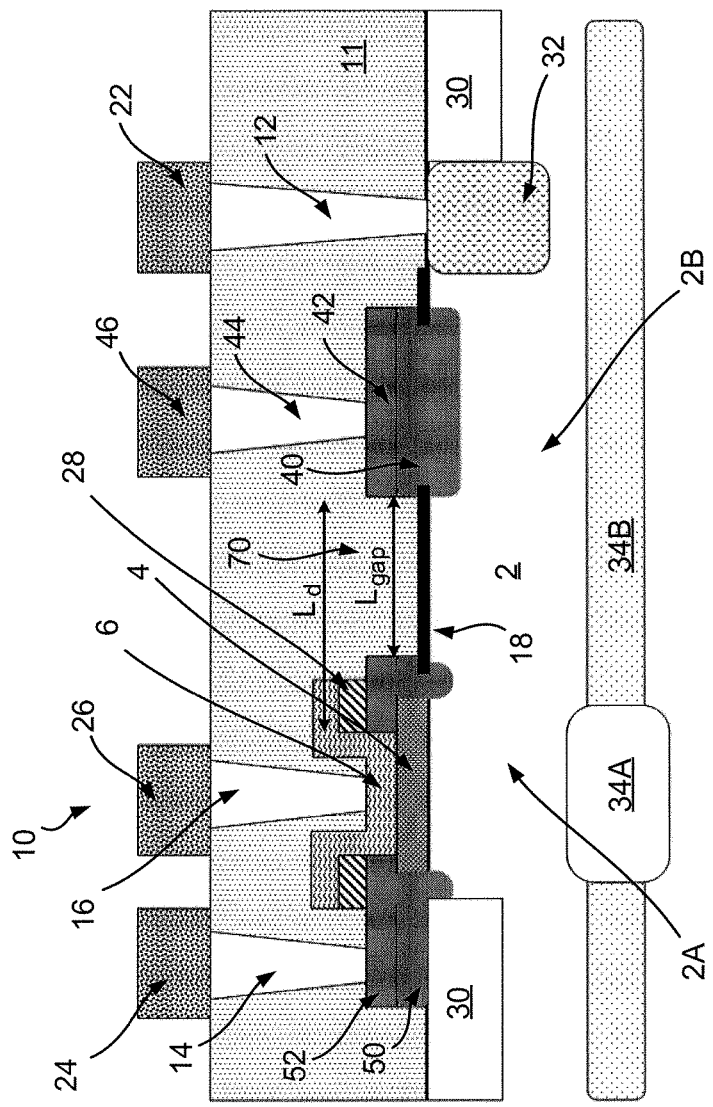
FIG. 1 shows a semiconductor device comprising a bipolar transistor in accordance with an embodiment of the invention.

FIG. 1 illustrates a semiconductor device 10 comprising a bipolar transistor in accordance with a first embodiment of the invention.

The bipolar transistor may be provided in a semiconductor substrate (for example, a silicon substrate). The substrate may include isolation regions 30 that can isolate the bipolar transistor from other regions of the substrate. The bipolar transistor includes a collector 2, a base 4 that is located above the collector 2 and an emitter 6 that is located above the base 4. The collector 2 includes a first region 2A, which is located directly beneath the base 4 of the device. The collector 2 also includes a laterally extending drift region 2B that extends laterally away from the first region 2A. The collector 2 may comprise an epitaxially grown doped layer having a first conductivity type (for example n-type or p-type). The base 4 may also comprise an epitaxially grown layer of semiconductor material. The base 4 has a second conductivity type, where the second conductivity type is different to the first conductivity type (for instance, where the connector 2 is p-type, the base 4 is n-type). The emitter 6 may also comprise an epitaxially grown layer of semiconductor material. The emitter 6 has the same conductivity type as the collector 2. Note that in this example, the layers forming the base 4 and the emitter 6 are provided as a vertical stack above the first region 2A of the collector 2.

The base 4 can comprise an intrinsic region which is monocrystalline (located directly above the first region 2A of the collector 2 and directly beneath the emitter 6 where the emitter makes contact with the base 4). The base 4 can also include an extrinsic region that is located on either side of the intrinsic region. The extrinsic region is labelled using reference numerals 50 and 52 in FIG. 1. The extrinsic region 50, 52 is comprised of the same material as the intrinsic, monocrystalline region of the base 4 but instead of being crystalline is typically amorphous. For instance, the extrinsic region 50, 52 of the base 4 may comprise polysilicon.

Located above the extrinsic region 52 of the base in this example is a dielectric portion 28. The dielectric portion 28 may, for example, comprise an oxide. The dielectric portion 28 has an opening in it through which the emitter 6 extends to make contact with an upper surface of the intrinsic region of the base 4. The opening in the dielectric layer 28 is referred to herein below as the "emitter window".

The part of the emitter 6 that makes contact with the intrinsic region of the base 4 is itself also monocrystalline, whereas the parts of the emitter 6 that are in contact with the dielectric portion 28 are typically amorphous and may again, for example, comprise doped polysilicon. Note that it is not possible or at least it is very difficult, to epitaxially grow monocrystalline layers in contact with a dielectric. It is for this reason that the part of the emitter 6 in contact with the dielectric portion 28 and also the extrinsic region of the base 50, 52 (which is located above the isolation region 30 and/or the dielectric layer 18 mentioned below in more detail) are amorphous.

The device further includes a collector contact 12 which makes contact with the collector 2 at a distal end of the laterally extending drift region 2B (the proximal end of the laterally extending drift region 2B being located adjacent the first region 2A). A doped portion 32 forming a collect sinker can be provided to allow an ohmic connection to be made between the laterally extending drift region 2B and the collector contact 12. The device can also include an emitter contact 16 and a base contact 14. The collector contact 12, emitter contact 16 and base contact 14 may comprise electrically conducting portions that extend through a dielectric layer 11 that extends over the surface of the semiconductor substrate in which the device is provided. Interconnects, for example, metallic interconnects in one or more metallisation layers may be provided in order to make contact with the above-mentioned contacts. For instance, interconnect 22 can connect to the connector contact 12, interconnect 24 can connect to the base contact 14 and interconnect 26 can connect to the emitter contact 16.

In some embodiments, a further doped region 34 can be provided beneath the collector 2. The further doped region has a first portion 34A and a second portion 34B. The first portion 34A is located substantially beneath the emitter window, whereas the second portion 34B extends laterally beneath the laterally extending drift region 2B of the collector 2. The doped region 34 forms a junction at a region of contact between the further doped region 34 and the collector 2. The further doped region 34 has a conductivity type that is different to the conductivity type of the collector 2. The further doped region 34 is optional and need not be provided. However, in examples where the further doped region 34 is present, a potential applied to the further doped region 34 (for example using a substrate contact) can be used to further shape the electric field within the collector 2. The doping level of the first portion 34A is greater than that of the doping level of the second portion 34B, which may for instance allow the field closer to the first region 2A of the collector 2 to be effectively shaped without leading to unwanted breakdown close to the collector sinker portion 32 of the device.

The bipolar transistor also includes a reduced surface field gate that is located above an upper surface of the laterally extending drift region 2B of the collector 2. The reduced surface field gate can, by application of a potential thereto, allow the electric field within the collector 2 to be shaped. For instance, by application of a potential to the reduced surface field gate, the electric field close to a base-collector junction of the device and/or in the laterally extending drift region 2B of the collector 2 can be shaped. In common with the collector 2, base 4 and emitter 6, the reduced surface field gate can be provided with a contact 44 in order to allow the above-mentioned potential to be applied. Electrically conductive interconnect 46 can allow appropriate connection to the contact 44 to be made.

In the present example, the reduced surface field (RESURF) gate is a junction RESURF gate that comprises a monocrystalline doped semiconductor portion 40 that is in contact with the upper surface of the laterally extending drift region 2B. The monocrystalline doped semiconductor portion 40 has a conductivity type that is different to that of the collector 2 (for instance, where the collector 2 is p-type, the monocrystalline doped semiconductor portion 40 is n-type, or vice versa). In this example, the reduced surface field gate also has an amorphous portion 42 which is located above the monocrystalline doped semiconductor portion 40. The contact 44 connects to the reduced surface field gate via the amorphous portion 42.

As shown in FIG. 1, the monocrystalline doped semiconductor portion 40 can extend through an opening in a dielectric layer 18 (for example, silicon dioxide) that is provided on an upper surface of the collector 2, to make a contact with the laterally extending drift region 2B. As noted above, since it is difficult to grow monocrystalline semiconductor material on a dielectric, it will be appreciated that the extreme edges of the monocrystalline portion 40 as shown in FIG. 1, namely those parts that are directly above the dielectric layer 18 may be amorphous.

As shown in FIG. 1, there is a gap 70 between the reduced surface field gate and an edge of the extrinsic region 50, 52 of the base. The lateral dimension of the gap 70 is denoted $L_{gap}$. In the present example, the gap 70 may be filled with the dielectric material 11 noted above. As will be described in more detail below, during manufacture, the monocrystalline doped semiconductor portion 40 of the reduced surface field gate may be formed from the same deposited layer as that which is used to form the intrinsic region of the base 4. The amorphous portion 42 of the reduced surface field gate may correspond to a layer that is used during manufacture to form the extrinsic region 52 of the base 4. As explained below, the gap 70 may be formed by etching away parts of the layers used to form the base 4 and the reduced surface field gate, located in between the active part of the bipolar transistor and the reduced surface field gate.

In some embodiments, the above-mentioned etching step can be performed using a conventional hard mask to define a window through which the gap 70 may be etched. However, as will be described below in relation to FIGS. 4 and 5, an alternative methodology may allow the size of the gap 70 $L_{gap}$ to be substantially smaller than that which can be achieved using a conventional hard mask (e.g. i line mask). In accordance with embodiments of this invention, using either a hard mask or the methodology described below in relation to FIGS. 4 and 5, it is envisaged that the lateral dimension $L_{gap}$ is in the range of 0.1 µm to 1.0 µm. It will be appreciated that it may, in some embodiments, be desirable to provide a device having a gap 70 that has a lateral dimension $L_{gap}$ that is as small as possible. In this way, the reduced surface field gate can be used to control a portion of the laterally extending drift region 2B of the collect 2 that is as close as possible to the active region of the device (the active region may correspond to the emitter window defined by the dielectric portion 28).

In FIG. 1, the dimension labelled $L_d$ corresponds to the lateral distance between an edge of the reduced surface field gate and the nearest edge of the emitter window of the device as defined by the opening in the dielectric layer 28. Note that $L_d$ is generally slightly larger than $L_{gap}$ due to the lateral extent of the dielectric portion 28 and the extrinsic region 50, 52 of the base 4. It will be appreciated that as the various parts of the device are typically formed using a number of deposition, masking and etching steps, the difference in lateral extent between $L_d$ and $L_{gap}$ may typically be defined by the minimum overlay tolerance associated with the photolithographic processes used. For instance, using current photolithographic technology, it is envisaged that the minimum lateral size of the dielectric portion 28 may be approximately 0.1 μm, whereas the minimum lateral extent of the part of the extrinsic region 52 of the base 4 that extends out from beneath the emitter 6 and dielectric portion 28 towards the gap 70 may be around 0.1 μm. The value of 0.1 μm here arises from the minimum overlay tolerance between the mask that is used to define the emitter 6 and the mask that is used to define the base 4. In this example therefore, the lateral extent of $L_d$ may typically be around 0.2 μm (=0.1 μm+0.1 μm) larger than the lateral extent of the gap 70 given by $L_{gap}$ (i.e. $L_d = L_{gap} + 0.2$ μm). Note that in the specific example shown in FIG. 1, the lateral size of the dielectric portion 28 is slightly larger (i.e. about 0.2 μm) than lateral extent of the part of the extrinsic region 52 of the base 4 that extends out from beneath the emitter 6 and dielectric portion 28 towards the gap 70 (about 0.1 μm), whereby the value of $L_d$ is given by $L_d = 0.2$ μm+0.1 μm+$L_{gap} = L_{gap} + 0.3$ μm. Thus, $L_d = L_{gap} + 0.2$ μm represents the smallest value of $L_d$ using this approach, but $L_d$ may, in some examples, be slightly larger than this minimum.

It will be appreciated that in some embodiments, the minimum overlay tolerance (for instance of 0.1 μm as noted above) may also apply to the reduced surface field gate and in particular to the opening in the dielectric layer 18 through which the monocrystalline doped semiconductor portion 40 extends. As noted above, the extreme edges of the monocrystalline doped semiconductor portion 40 may in fact be amorphous since they are located above the dielectric layer 18. The amount of overlay between the monocrystalline doped semiconductor portion 40 and the dielectric layer 18 at the edges of the opening in the dielectric layer 18 is also defined by the minimum overlay tolerance and in the present example is again around 0.1 μm.

The minimum overlay tolerances noted above may vary according to the photolithographic technology used.

Using a conventional i line mask (365 nm), it has been found that the minimum value of $L_{gap}$ that can be produced is around 0.5 μm. Although in some embodiments the value of $L_{gap}$ may be larger than 0.5 μm, in order to ensure that effective field shaping can take place in the collector 2 close to the active region, it is envisaged that the value of $L_{gap}$ should at most be around 1.0 μm. Since the value of $L_d$ as noted above in the present example is typically around 0.3 μm greater than the value of $L_{gap}$, it follows that in the present embodiment the value of $L_d$ is in the range 0.7-1.2 μm.

Figure 2:
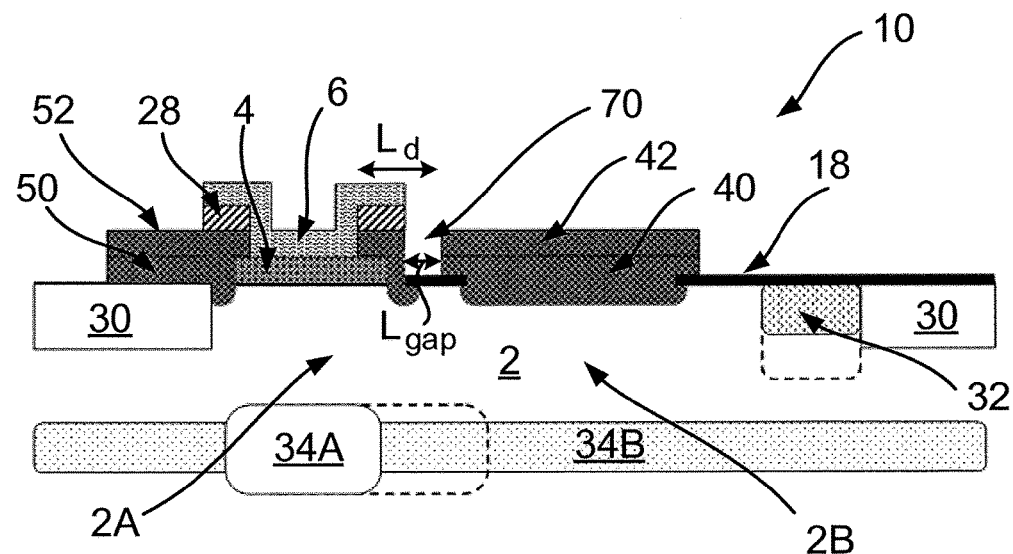
FIG. 2 shows a semiconductor device comprising a bipolar transistor in accordance with another embodiment of the invention.

FIG. 2 illustrates a semiconductor device in accordance with another embodiment of this invention. The example shown in FIG. 2 is similar in many respects to the example shown above in relation to FIG. 1. Before moving on to the main difference between the example of FIG. 2 and the example of FIG. 1, it is noted that FIG. 2 shows that the vertical extent of the collector sinker 32 may be varied according to design requirements (see the dashed line located beneath the collector sinker 32 which is indicative of the variation in its vertical extent). Additionally, FIG. 2 schematically shows that the lateral extent of the first region 34A of the further doped portion 34 may be varied in accordance with design requirements. For instance the first portion 34A may have a lateral extent that allows it to extend completely beneath the gap 70 between the extrinsic base region and the reduced surface field gate. In this example, it may be beneficial to extend the more highly doped part 34A of the further doped region 34 beneath the gap 70, given that the amount of field control offered by the reduced surface field gate above the laterally extending drift region 2B of the collector 2 may be limited in this area.

In FIG. 2, the various contacts (for example, the contacts 12, 14, 16 and 44) as well as the electrically conductive interconnects and the dielectric layer 11 are not shown (but may, of course, be present).

The main difference between the example of FIG. 2 and the example of FIG. 1 is that the lateral dimension $L_{gap}$ of the gap 70 in the example of FIG. 2 is substantially smaller than that shown in FIG. 1. The lateral dimension between the reduced surface field gate and the emitter window ($L_d$) is thus also smaller. As will be described below, in accordance with embodiments of this invention, the value of $L_{gap}$ may made be smaller than the minimum dimension that is possible when using a normal hard mask. In the example of FIG. 1, an i-line mask was used to etch the gap 70, leading to a minimum size gap of approximately 0.5 μm. In the example of FIG. 2, the value of $L_{gap}$ is smaller than 0.5 μm.

Using the methodology described below in relation to for example, FIGS. 4 and 5, it is envisaged that the value of $L_{gap}$ may be as small as 0.2 μm or even 0.1 μm. As has been discussed already above, the relatively small size of the gap 70 can provide benefits such as allowing for control of the field within the collector 2 (using the reduced surface field gate) as close as possible to the active region of the device defined by the emitter window.

In the example of FIG. 2 (and also FIG. 3 below), note that the lateral extent of the extrinsic region 50, 52 of the base 4 adjacent the gap 70 matches that of the dielectric portion 28. This structural difference arises from the way in which the gap 70 is etched, as will be explained below in more detail.

It is envisaged that the minimum lateral size of the dielectric portion 28 and also of the minimum lateral extent of the part of the extrinsic region 52 adjacent the gap 70 may be approximately 0.1 μm. This structural difference means that the reduced surface field gate can be positioned slightly closer (by a further 0.1 μm as compared to the example of FIG. 1) to the active region of the device. In this example therefore, the lateral extent of $L_d$ may typically be around 0.1 μm larger than the lateral extent of the gap 70 given by $L_{gap}$. Thus, the value of $L_d$ may be as small as 0.3 μm or even 0.2 μm (corresponding to values of $L_{gap}$ of 0.2 μm and 0.1 μm, respectively).

Figure 3:
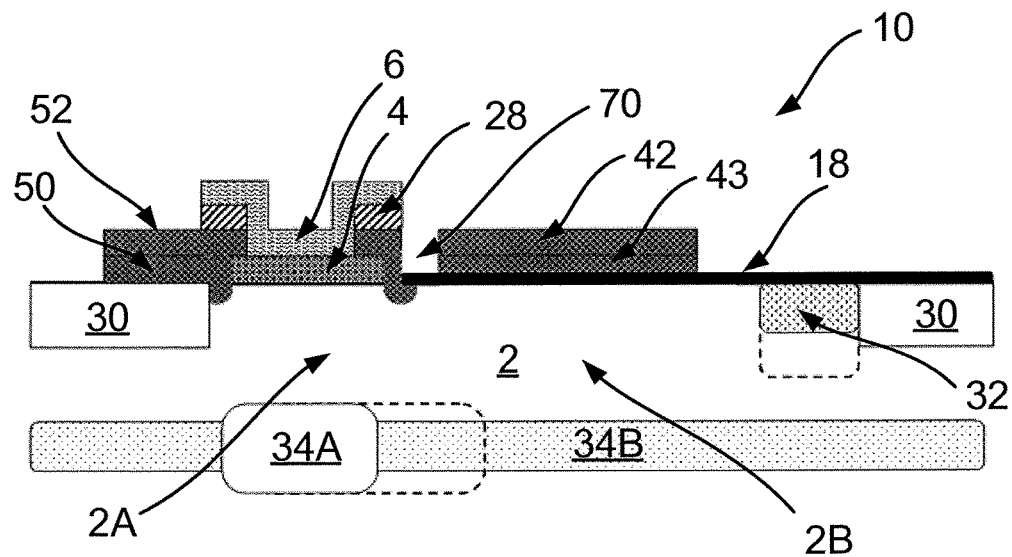
FIG. 3 shows a semiconductor device comprising a bipolar transistor in accordance with a further embodiment of the invention.

FIG. 3 illustrates a further example of a device in accordance with an embodiment of this invention. The device shown in FIG. 3 is substantially similar to that shown in FIG. 2 with the exception that in the example of FIG. 3 the reduced surface field gate comprises a RESURF plate. In particular, in this example the reduced surface field gate comprises a dielectric layer 18 that extends across an upper surface of the collector 2 and in particular across the surface of the laterally extending drift region 2B thereof. One or more semiconductor layers 42, 43 are provided above the dielectric layer 18 and a potential may be applied to these layers using a contact of the kind described above in relation to the reduced surface field gates in FIGS. 1 and 2 in order to allow for field shaping in the region of the laterally extending drift region 2B that is directly below the semiconductor layers 42, 43. In common with the previous examples, a gap 70 is located between the reduced surface field gate comprising the one or more layers 42, 43 and the extrinsic region 52 of the base 4. The lateral dimension $L_{gap}$ of the gap 70 may be of a similar size to that noted above in relation to FIGS. 1 and 2. In the specific example shown in FIG. 3, the gap 70 is approximately the same size as the gap 70 shown in the example of FIG. 2, and can be etched in a similar way.

Figure 4:
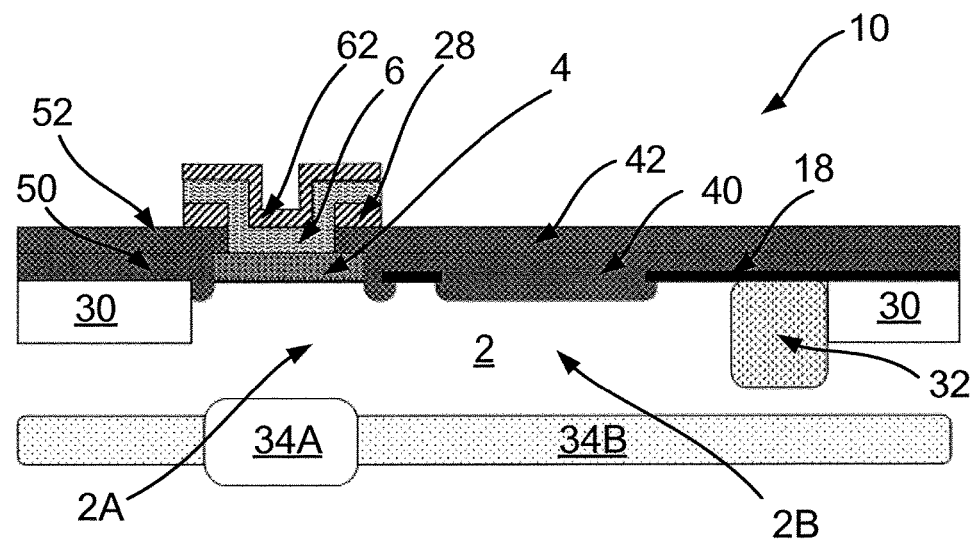
FIG. 4 illustrates an example steps for use in a method of making a bipolar transistor in accordance with an embodiment of the invention
Figure 5:
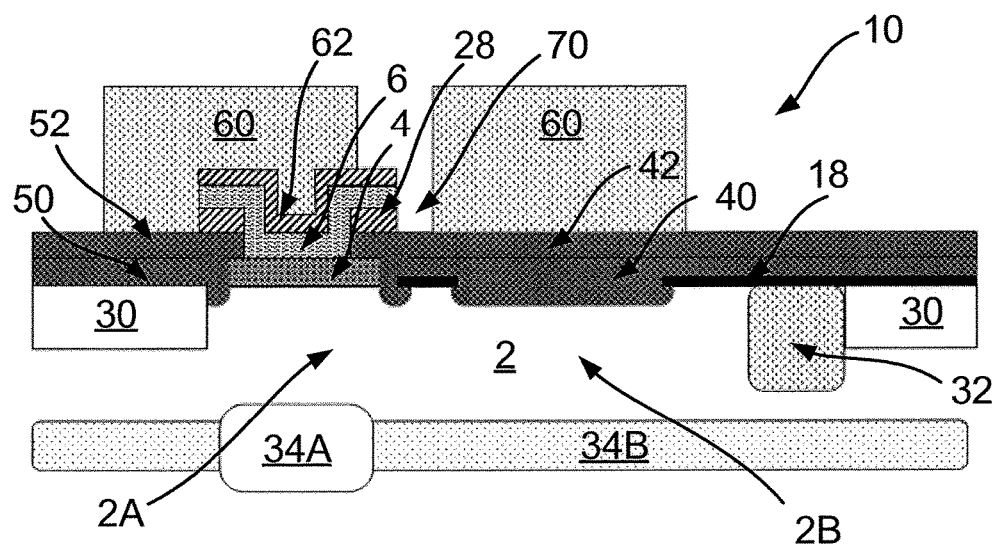
FIG. 5 illustrates an example steps for use in a method of making a bipolar transistor in accordance with an embodiment of the invention.

FIGS. 4 and 5 schematically illustrate steps for forming a device of the kind described above. In particular, the example steps shown in FIGS. 4 and 5 may be used to produce a gap 70 that has lateral dimension $L_{gap}$ as small as 0.2 μm or even 0.1 μm)

FIG. 4 shows the layout of a device that is partially manufactured and which is ready for the performance of an etching step to form the gap 70 of the kind described in relation to the previous embodiments. As noted above, in some examples, including the example of FIG. 4, the layers used to form the features of the base (in particular the intrinsic and extrinsic regions) may also be used to form the reduced surface field gate. This is illustrated in FIG. 4 in which it may be seen that a layer 50 and a layer 52 defines the subsequently to be formed extrinsic region of the base 4 and the intrinsic region also, as well as the monocrystalline doped semiconductor portion 40 and the amorphous portion 42 of the reduced surface field gate described above. As also noted above, the formation of a gap 70 in these layers can act to electrically isolate the base from the reduced surface field gate thereby to reduce capacitance between the base and the collector.

In this first step, a hard mask 62 (for example, a (TEOS) layer) is deposited over the emitter 6. TEOS is a Low-Pressure Chemical Vapour Deposited (LPCVD) silicon dioxide layer that is commonly used in silicon technology. This hard mask 62 may be formed using a standard deposition process. The hard mask 62 will form a first edge of the gap 70 and will protect the emitter 6 during the subsequent etching to form the gap 70. The thickness of the hard mask 62 should be chosen to ensure that during the subsequent etch, the underlying emitter 6 is not exposed. Trials have shown that lateral under etching of the emitter 6 is minimal.

In a next step illustrated in FIG. 5, a layer of photoresist 60 is deposited. The layer of photoresist 60 is then patterned to produce an opening through which an edge of the hard mask 62 for defining the first edge of the gap 70 is exposed. Note that the lateral dimension of the opening in the photoresist 60 is typically larger than the eventual size of the gap 70, since at least part of the opening in the photoresist layer 60 is occupied by the dielectric layer 28, emitter 6 and hard mask 62. A second edge of the gap 70 is defined by an edge of the opening in the photoresist layer 60 that is opposite the edge of the hard mask 62 facing the laterally extending drift region 2A. In order to form a gap 70 that is as small as possible, it is envisaged that the opening in the photoresist 60 should be located such that the edge of the opening in the photoresist 60 that is opposite the edge of the hard mask 62 is as close as possible to the edge of the hard mask 62. It has been found that this lateral dimension can be made as small as 0.1 μm (this is limited by the minimum overlay tolerance of the photolithography technology used), whereby $L_{gap}$=0.1 μm is also the smallest lateral dimension of the gap 70 that can be produced. $L_{gap}$=0.1 μm is substantially smaller than the value of $L_{gap}$ described above in relation to FIG. 1.

After the opening in the photoresist layer 60 has been formed, the etch step may be completed to form a gap 70, which would result in a structure of the kind shown in, for example, FIG. 2. Subsequently, the photoresist 60 may be removed.

Note that the edges of the emitter 6, the dielectric layer 28 and the extrinsic portion 52 of the base 4 produced by this etching technique are all vertically aligned as shown in FIGS. 2 and 3. This differs from the example of in FIG. 1, in which the use of separate masks to pattern the emitter 6 and the base 4 causes to a portion of the extrinsic region 50, 52 of the base 4 to extend out from beneath the emitter 6. It is envisaged that the observation of vertically aligned edges in these parts of the device may be indicative that a methodology of the kind described in relation to FIGS. 4 and 5 has been used to produce the gap 70.

Because the lateral dimension $L_{gap}$ is defined by the respective edges of a hard mask of the kind shown in FIG. 5 (hard mask 62) and a separately deposited and patterned photoresist layer, the lateral dimension $L_{gap}$ may be much smaller than would normally be afforded by a conventional mask and etch process. The later process may, for example, allow a gap no smaller than around 0.5 μm to be produced whereas the method shown in FIGS. 4 and 5 may allow a gap as small as 0.1 μm.

In FIGS. 4 and 5, the reduced surface field gate comprises RESURF junction of the kind shown in FIG. 2. However, it will be appreciated that the etching steps described in relation to FIGS. 4 and 5 may also be used to form the gap 70 in embodiments in which the reduced surface field gate comprises a RESURF field plate (e.g. as shown in FIG. 5).

Figure 6:
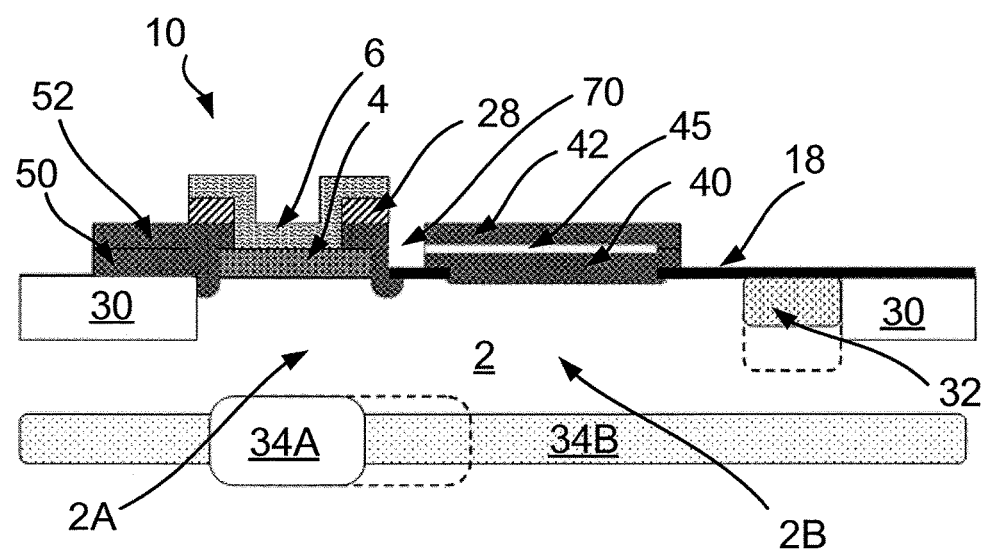
FIG. 6 shows a semiconductor device comprising a bipolar transistor in accordance with another embodiment of the invention.

FIG. 6 illustrates a further example of a device in accordance with an embodiment of this invention. Again, in FIG. 6, the features of the contacts and connections shown in FIG. 1 are omitted, although they may of course be present. In some examples, the extrinsic region of the base may include two layers 50, 52. The upper layer 52 may be doped and these dopants may diffuse into the underlying layer 50 (and into the intrinsic region of the base 4) during a heating step during manufacture. Although the doping of these layers is useful for formation of the base 4, as noted above, these same layers may be used in some examples for forming the reduced surface field gate.

It has been found that for optimal field shaping within the collector 2, the doping level within the monocrystalline doped semiconductor portion 40 may be carefully selected. For instance, it has been found that the doping level within the monocrystalline doped semiconductor portion 40 may advantageously be approximately the same as the doping level within the second portion 34B of the further doped region 34 described above. The provision of dopants in the layer 52, which may correspond to the layer 42 above the monocrystalline doped semiconductor portion 40 and the subsequent diffusion of these dopants into the monocrystalline doped semiconductor portion 40 may prevent adequate control of the level of dopants within the monocrystalline doped semiconductor portion 40. In order to mitigate this, in the embodiment of FIG. 6, an intervening layer 45 is provided between the layer 42 and the monocrystalline doped semiconductor portion 40, which acts as a barrier that prevents diffusion of any dopants in the layer 42 into the monocrystalline doped semiconductor portion 40. The layer 45 may comprise a dielectric such as TEOS, silicon nitride or a combination thereof. It is noted that the layer 45 located between the doped polysilicon layer 42 and the monocrystalline layer 40 does not extend completely across the interface between the two layers. Instead, as shown in FIG. 6, there is still at least some area of contact between the layers 40 and 42 to allow appropriate electrical connection to be made to the monocrystalline doped semiconductor portion 40 via the polysilicon layer 42.

According to an embodiment of the invention, a semiconductor device of the kind described herein may be provided in a power amplifier.

Accordingly, there has been described a semiconductor device comprising a bipolar transistor and a method of making the same. The bipolar transistor includes a collector having a laterally extending drift region. The bipolar transistor also includes a base located above the collector. The bipolar transistor further includes an emitter located above the base. The bipolar transistor also includes a reduced surface field (RESURF) gate located above an upper surface of the laterally extending drift region for shaping an electric field within the collector. The bipolar transistor further includes a gap located between the reduced surface field gate and an extrinsic region of the base of the device, for electrically isolating the reduced surface field gate from the base. A lateral dimension $L_{gap}$ of the gap is in the range 0.1 µm≤$L_{gap}$≤1.0 µm.

Although particular embodiments of the invention have been described, it will be appreciated that many modifications/additions and/or substitutions may be made within the scope of the claimed invention.

What is claimed is:

1. A semiconductor device comprising a bipolar transistor, the bipolar transistor comprising:
   a collector having a laterally extending drift region;
   a base located above the collector, wherein an extrinsic region of the base at least partially surrounds an intrinsic region of the base that is located above an upper surface of the laterally extending drift region;
   an emitter located above the base;
   a reduced surface field (RESURF) gate located above the upper surface of the laterally extending drift region for shaping an electric field within the collector; and
   a gap located between the reduced surface field gate and the extrinsic region of the base of the device, and filled with a dielectric material for electrically isolating the reduced surface field gate from the base,
   wherein a lateral dimension $L_{gap}$ of the gap is in the range 0.1 µm≤$L_{gap}$≤1.0 µm.

2. The semiconductor device of claim 1, wherein a lateral distance $L_d$ between the reduced surface field (RESURF) gate and an emitter window of the device is in the range 0.2 µm≤$L_d$≤1.2 µm.

3. The semiconductor device of claim 1, wherein $L_{gap}$<0.5 µm.

4. The semiconductor device of claim 3, wherein a lateral distance $L_d$ between the reduced surface field (RESURF) gate and an emitter window of the device is in the range 0.2 µm≤$L_d$<0.6 µm.

5. The semiconductor device of claim 3, wherein $L_{gap}$≤0.2 µm.

6. The semiconductor device of claim 5, wherein a lateral distance $L_d$ between the reduced surface field (RESURF) gate and an emitter window of the device is in the range 0.2 µm≤$L_d$≤0.3 µm.

7. The semiconductor device of claim 1, wherein the reduced surface field gate includes a monocrystalline doped semiconductor portion in contact with the upper surface of the laterally extending drift region, wherein the monocrystalline doped semiconductor portion has a different conductivity type to that of the collector whereby a junction is formed at an interface between the monocrystalline doped semiconductor portion and the laterally extending drift region.

8. The semiconductor device of claim 7 further comprising:
   a doped polysilicon layer located above the monocrystalline doped semiconductor portion, wherein the doped polysilicon layer corresponds to the extrinsic region of the base, and
   a layer located between the doped polysilicon layer and the monocrystalline doped semiconductor portion, for preventing dopants from the doped polysilicon layer entering the monocrystalline doped semiconductor portion.

9. The semiconductor device of claim 1, wherein the reduced surface field gate comprises a field plate separated from the upper surface of the laterally extending drift region by a dielectric.

10. The semiconductor device of claim 1, comprising a further doped region having a conductivity type that is different to that of the collector, the further doped region extending laterally beneath the collector to form a junction at a region of contact between the further doped region and the collector.

11. A power amplifier comprising the semiconductor device of claim 1.

12. A method of making a semiconductor device comprising a bipolar transistor, the method comprising:
   providing a semiconductor substrate;
   forming a collector on the substrate, the collector having a laterally extending drift region;
   forming a base above the collector, wherein an extrinsic region of the base at least partially surrounds an intrinsic region of the base that is located above an upper surface of the laterally extending drift region;
   forming an emitter above the base;
   forming a reduced surface field (RESURF) gate above the upper surface of the laterally extending drift region for shaping an electric field within the collector; and
   etching a gap between the reduced surface field gate and the extrinsic region of the base of the device, and filling the gap with a dielectric material for electrically isolating the reduced surface field gate from the base,
   wherein a lateral dimension $L_{gap}$ of the gap is in the range 0.1 µm≤$L_{gap}$≤1.0 µm.

13. The method of claim 12, wherein a lateral distance $L_d$ between the reduced surface field (RESURF) gate and an emitter window of the device is in the range 0.2 µm≤$L_d$≤1.2 µm.

14. The method of claim 12, wherein $L_{gap}$<0.5 µm, and wherein the method further includes:
   depositing a dielectric layer over the emitter, wherein an edge of the dielectric layer defines a first edge of the gap;
   depositing a photoresist layer, wherein the photoresist layer includes an opening through which the edge of the dielectric layer defining the first edge of the gap is exposed and wherein an edge of the opening opposite the edge of the dielectric layer defines a second edge of the gap; and
   etching said gap.

15. The method of claim 14, wherein after the gap is etched, an edge of the emitter proximal the gap is vertically aligned with an edge of the extrinsic region of the base proximal the gap.

* * * * *